United States Patent
Fujimura et al.

(10) Patent No.: US 7,175,705 B2
(45) Date of Patent: Feb. 13, 2007

(54) PROCESS FOR PRODUCING COMPOUND SEMICONDUCTOR SINGLE CRYSTAL

(75) Inventors: Shigeto Fujimura, Toda (JP); Toshiaki Asahi, Toda (JP); Kenji Sato, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 667 days.

(21) Appl. No.: 09/753,662

(22) Filed: Jan. 4, 2001

(65) Prior Publication Data

US 2001/0007239 A1     Jul. 12, 2001

(30) Foreign Application Priority Data

Jan. 7, 2000    (JP) .............. 2000-001675

(51) Int. Cl.
*C30B 15/00*   (2006.01)
*C30B 27/00*   (2006.01)

(52) U.S. Cl. .......................... 117/81; 117/82
(58) Field of Classification Search ............ 117/73–83, 117/81, 82
See application file for complete search history.

(56) References Cited

U.S. PATENT DOCUMENTS

| | | | | |
|---|---|---|---|---|
| 3,966,881 A | * | 6/1976 | Ayabe | 423/299 |
| 4,721,539 A | * | 1/1988 | Ciszek | 148/400 |
| 4,840,699 A | * | 6/1989 | Khattak et al. | 156/616.41 |
| 4,853,066 A | * | 8/1989 | Yoshida et al. | 156/616.4 |
| 5,075,055 A | * | 12/1991 | Finicle | 264/81 |
| 5,554,219 A | * | 9/1996 | Fukuda et al. | 117/83 |
| 5,603,763 A | * | 2/1997 | Taniguchi et al. | 117/83 |
| 5,871,580 A | * | 2/1999 | Asahi et al. | 117/83 |
| 5,989,337 A | * | 11/1999 | Sato | 117/81 |
| 6,273,969 B1 | * | 8/2001 | Dutta et al. | 148/404 |
| 6,290,773 B1 | * | 9/2001 | Mizuniwa et al. | 117/81 |
| 6,299,680 B1 | * | 10/2001 | Koyama et al. | 117/2 |

FOREIGN PATENT DOCUMENTS

| | | |
|---|---|---|
| EP | 0486698 A | 5/1992 |
| EP | 0529963 A2 | 3/1993 |
| EP | 0529963 A3 | 3/1993 |
| EP | 05058772 A | 3/1993 |
| EP | 07291782 A | 11/1995 |

OTHER PUBLICATIONS

Kingery et al., Introduction to Ceramics, 2nd Ed., John Wiley and Sons, New York, NY, pp. 328-336, 1976.*

(Continued)

*Primary Examiner*—Robert B. Davis
(74) *Attorney, Agent, or Firm*—Birch, Stewart, Kolasch & Birch, LLP

(57) ABSTRACT

A process for producing compound semiconductor single crystal, comprises the steps of: putting a compound semiconductor raw material into a crucible, setting the crucible in a vertical type of heating furnace to heat and melt the raw material by a heater, promoting a nucleation on a surface of a raw material melt by leaving a solid raw material in a part of the raw material melt, solidifying the raw material melt gradually from the surface of the raw material melt without a seed crystal, and growing a crystal by using a nucleus generated by the nucleation.

9 Claims, 2 Drawing Sheets

OTHER PUBLICATIONS

Kingery et al., Introduction to Ceramics, $2_{nd}$ Edition, JohnWiley and Sons, New York, USA, pp. 328-346, 1976.*

M. Muhlberg et al.; Journal of Crystal Growth; vol. 128; pp. 571-575; 1993.

T. Asahi et al.; Journal of Crystal Growth; vol. 161; pp. 20-27; 1996.

M. Muhlberge et al.; Journal of Crystal Growth, vol. 128, No. PT 02 01/04; Mar. 1, 1993, pp. 571-575.

* cited by examiner

PROCESS FOR PRODUCING COMPOUND SEMICONDUCTOR SINGLE CRYSTAL

BACKGROUND OF THE INVENTION

1. Field of the Invention

The present invention relates to a process for producing a compound semiconductor single crystal. Further, the present invention relates to a useful technique which is adapted to, for example, the vertical gradient freezing method and the vertical Bridgman method in which a single crystal is grown in a vertical direction by cooling a raw material melt of a compound semiconductor.

2. Description of the Related Art

In general, when a compound semiconductor single crystal is produced, the liquid encapsulated Czochralski method (hereinafter, referred to as "LEC method"), or the horizontal Bridgman method (hereinafter, referred to as "HB method") is industrially used. In the LEC method, there are some merits, for example, that a wafer having a cross section formed in a circle and a large diameter can be obtained, and that a crystal having a high purity can be obtained by using a liquid encapsulant ($B_2O_3$). However, there are some demerits, for example, that because a temperature gradient in the crystal growth direction is high, a dislocation density in the crystal becomes high. As a result, electric properties of an electronic device, such as an FET (field effect transistor) or the like, which is made from the obtained crystal, deteriorate.

On the other hand, in the HB method, there is a merit that because a temperature gradient in the crystal growth direction is low, a crystal having a low dislocation density can be obtained. However, there are some demerits, for example, that because a raw material melt of a compound semiconductor is solidified in a crucible formed in a boat-shape, it is hard to enlarge the diameter of the obtained wafer. Further, the obtained wafer has a cross section formed in a substantial D-shape.

As a crystal growth method having the merits of the LEC method and those of the HB method, the vertical gradient freezing method (hereinafter, referred to as "VGF method") and the vertical Bridgman method (hereinafter, referred to as "VB method") have been proposed. The VGF method and the VB method are carried out as follows. A crucible containing a compound semiconductor raw material is disposed in a vertical type of heating furnace. After the raw material is heated and molten by a heater, the raw material melt is gradually solidified in the vertical direction from a seed crystal portion disposed on the bottom portion of the crucible to grow a single crystal. In these methods, because a cylindrical crucible is used, a circular wafer can be obtained. Further, because a temperature gradient in the crystal growth direction is low, a crystal having a low dislocation density can be obtained.

The liquid encapsulated Kyropoulos method (hereinafter, referred to as "LEK method") in which a seed crystal disposed in an upper portion of a crucible containing a raw material is in contact with a surface of the raw material melt and then a single crystal is grown in the crucible by gradually solidifying the melt from the surface thereof, have a merit that a circular wafer can be obtained and that a crystal having a low dislocation density can be easily obtained, like the VGF method and the VB method.

However, a crystal grown in the VGF method, the VB method or the LEK method, has a demerit that a twin or a polycrystal is easily generated from a seed crystal to a body part of the crystal. Further, the yield of the single crystal is low. In particular, because a twin or a polycrystal is easily generated in a material having a low stacking fault energy or a low critical shear stress, it is hard to grow a single crystal of the material.

Further, in the VGF method or the VB method, because a crystal is grown by disposing a seed crystal on the bottom portion of the crucible, it is necessary to use the crucible having a containing portion for a seed crystal on the bottom thereof. However, such a crucible has a demerit that because the crucible has a special shape, it is more expensive than a crucible having a flat bottom, which is generally used. Further, the seed crystal containing portion of the crucible is easily damaged. Therefore, the producing cost of the crystal increases.

The inventors have studied a process for growing a crystal on the basis of a nucleus generated by adjusting a temperature of a raw material melt and a pressure thereof without a seed crystal in the VGF method, the VB method or the LEK method. The process was an effective one for growing a group II-VI compound semiconductor single crystal in which a twin or a polycrystal was easily generated from a seed crystal to a body part of the crystal. Further, in the process, because a crucible having a flat bottom might be used, the used crucible was relatively cheap and was not easily damaged. Further, because it was not necessary that a seed crystal was used, the cost of the seed crystal was not required. The process had the advantage of reducing the producing cost of the crystal.

In the process for crystallizing a raw material melt without a seed crystal as described above, it is necessary that a nucleus is reproducibly generated in a raw material melt. However, when the raw material melt is gently and slowly cooled in a state that a seed of the crystal does not exist in the raw material melt, there is some possibility that a supercooling state in which the melt is not transited to solid even though the temperature of the melt is not higher than the melting point thereof, is caused. In this case, a plurality of nuclei are generated when the temperature of the melt is several tens ° C. lower than the melting point thereof. Because the melt is rapidly solidified on the basis of the nuclei, a polycrystal or a twin is grown. As a result, a single crystal is not grown.

As described above, in the process for growing a crystal without a seed crystal, the possibility that the supercooling state is caused becomes high according to a material of a crystal to be grown and a growing condition. As a result, there is a problem that the percentage of growing the single crystal is low.

According to the report (M. Muhlberg et al. Journal of Crystal Growth, Vol. 128, (1993) pp 571–575), when a deviation between a temperature at which a supercooled liquid is solidified and the melting point of the supercooled liquid is defined as a degree of supercooling, the degree of supercooling is correlated with a holding temperature of the melt. In the concrete, it is reported that the degree of supercooling becomes low when a difference between a temperature at which the raw material is held in a melt state and the melting point of the raw material is small.

The inventors noticed the study described in the above report and studied the relationship between the holding temperature of the melt and the occurrence of the supercooling state by using a compound ZnTe. As a result, the inventors found that the melt was not in the supercooling state and the melt begun to be solidified near the melting point thereof by holding the melt in the temperature range of the melting point to (the melting point+8)° C.

According to this finding, when a crystal is grown by gradually cooling the raw material melt after the raw material melt is held in the above temperature range, the supercooling state is not caused. Therefore, a single crystal ought to be obtained. However, although the crystal growth was carried out by the above process ten and several times, the possibility that a single crystal could not be obtained was about 50%. A single crystal could not be reproducibly grown only by adjusting the condition of the holding temperature of the melt.

The inventors studied the cause that the single crystal could not be obtained. As a result, the inventors found that the crystal which was obtained by generating a plurality of nuclei on the surface of the melt and then growing a ZnTe crystal around each nucleus, was a polycrystal. Further, a part of raw material kept unmolten when the holding temperature of the melt was near the melting point. It was found that the ZnTe polycrystal was grown on the surface of the melt by the unmolten material.

In order not to leave the unmolten material on the surface of the melt, the inventors studied the holding time of the melt and the holding temperature thereof. However, although the holding time of the melt was extended, the effect that the unmolten material was not left could not be obtained remarkably. When the holding temperature of the melt increased, the possibility that the supercooling state was caused became high. As a result, a polycrystal or a twin was generated. Therefore, these solutions could not be effective.

SUMMARY OF THE INVENTION

The solution of the above-described problems is proposed by the present invention. An object of the present invention is to provide a process for producing a compound semiconductor single crystal, which is a crystal growth method for gradually solidifying a melt in a vertical direction from the surface of the melt without a seed crystal and in which a single crystal containing no a polycrystal or a twin can be produced at a good yield.

In order to achieve the above-described object, in accordance with one aspect of the present invention, a process for producing compound semiconductor single crystal, comprises the steps of:

putting a compound semiconductor raw material into a crucible, setting the crucible in a vertical type of heating furnace to heat and melt the raw material by a heater, promoting a nucleation on a surface of a raw material melt by leaving a solid raw material in a part of the raw material melt, solidifying the raw material melt gradually from the surface of the raw material melt without a seed crystal, and growing a crystal by using a nucleus generated by the nucleation.

According to the process, when the melt is cooled, the nucleus can be generated on the surface of the melt before the melt is in the supercooling state. Therefore, it can be prevented that a large number of nuclei are generated on the surface of the melt by the supercooling and that a polycrystal or a twin is generated. As a result, a high quality single crystal can be produced reproducibly.

Hereinafter, the consideration for accomplishing the present invention by the inventors and the research therefor will be summarized.

At first, because the supercooling is a phenomenon in which even though the temperature of the melt is lower than the melting point thereof, a nucleus is not generated in the melt and the melt does not begin to be solidified, the inventors thought that the melt could be prevented from being in the supercooling state by supplying a nucleus for the melt (or by promoting the nucleation) in a certain method. Further, it was found that a seed crystal used in an original crystal growth made a crystal be grown in the same orientation as the crystal orientation of the seed crystal and prevented the melt from being in the supercooling state.

However, in a group II-VI compound semiconductor single crystal having a low stacking fault energy or a low critical shear stress, because a polycrystal or a twin is easily generated by a stress from a seed attaching portion when a seed crystal is used, it is not preferable to use a seed crystal. The inventors studied about the process for growing a crystal without a seed crystal. As a result, it was found that the nucleation could be promoted on the surface of the melt by leaving a part of the raw material in a solid state in the raw material melt (at the bottom of the crucible). On the basis of this, the following process for growing a single crystal was proposed. A raw material of a compound semiconductor was molten so as to leave a part of the raw material of the compound semiconductor in a solid state. After the raw material was molten by holding a temperature distribution thereof to cause the surface of the raw material melt to be in a liquid state completely for a certain time, the melt was solidified from the surface of the melt while gradually cooling the melt. According to the process, although the surface of the raw material melt is sufficiently molten by increasing the temperature of the surface of the melt not less than 15° C. to prevent a polycrystal from being grown by an unmolten material on the surface of the melt, a nucleus is easily generated in a step of cooling the melt. Therefore, the supercooling is not caused like an earlier development. Further, because a seed crystal is not used, a polycrystal or a twin to be generated by a stress from a seed attaching portion is not generated. It is possible to reproducibly obtain a single crystal.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, a preferred embodiment of the present invention will be explained with reference to the drawings.

In the embodiment, the present invention will be explained by exemplifying a compound ZnTe which is one of the group II-VI compound semiconductor single crystals.

Figure 1A:
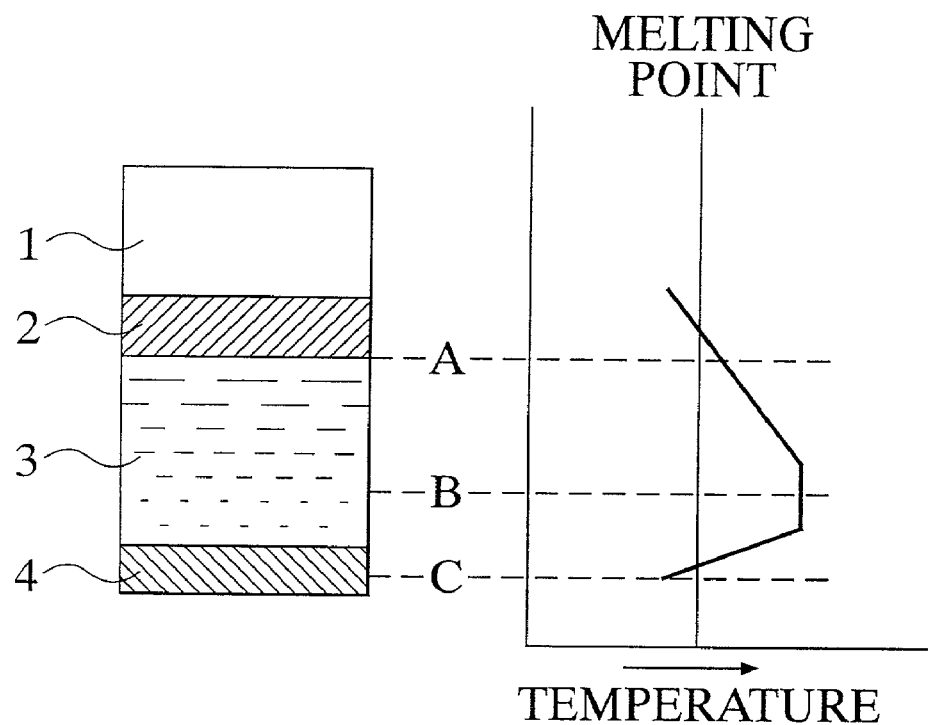
FIG. 1A is a schematic explanation view showing the inside of a crucible having a flat bottom and a temperature distribution thereof and FIG. 1B is a schematic explanation view showing the inside of a crucible having a containing portion and a temperature distribution thereof.
Figure 1B:
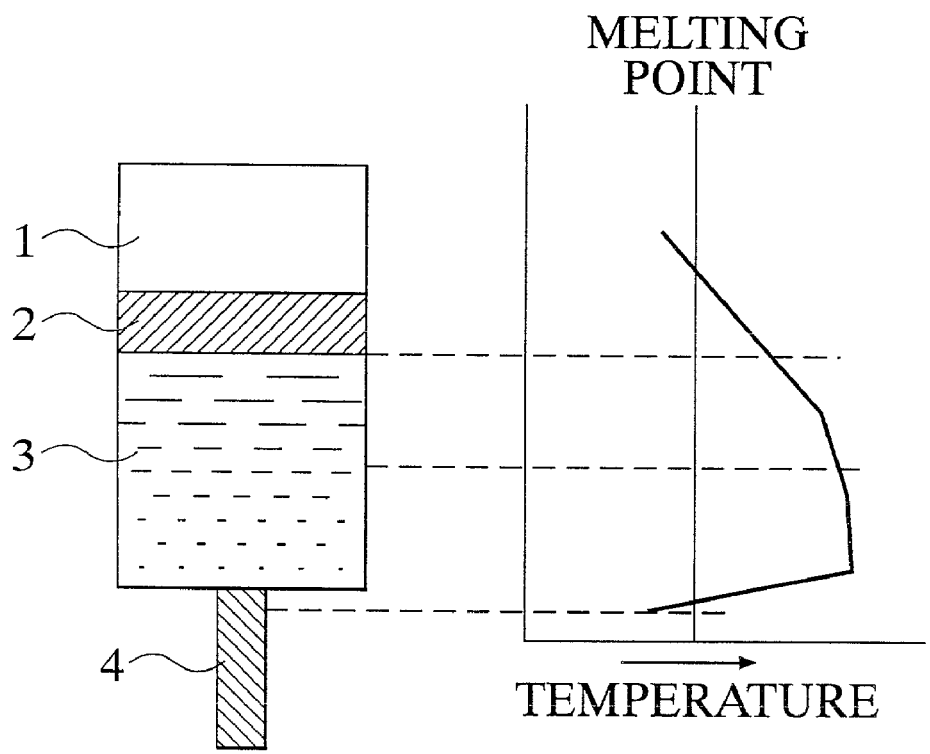

FIGS. 1A and 1B are schematic explanation views showing a raw material of the compound semiconductor in a container for crystal growth (a crucible made of pBN), which is set in a crystal growth apparatus, and a temperature distribution thereof according to the embodiment. FIG. 1A shows the case in which a crystal is grown by using a crucible having a flat bottom. FIG. 1B the case in which a crystal is grown by using a crucible having a containing portion for leaving the raw material in a solid state.

In the drawings, the reference numeral 1 denotes a crucible made of pBN. The reference numeral 2 denotes an encapsulant ($B_2O_3$). The reference numeral 3 denotes a raw material melt. The reference numeral 4 denotes a solid raw material.

The case in which a crystal is grown by using a crucible having a flat bottom shown in FIG. 1A will be explained. The components Zn and Te are put into a crucible having a cylindrical shape with a bottom in the equivalent molar ratio. Further, the encapsulant ($B_2O_3$) is put into the crucible. The crucible is set in a high pressure furnace. After the furnace is filled with an inert gas at a predetermined pressure, the crucible is heated by a heater having an inner diameter which is not less than 1.5 times larger than the inner diameter of the crucible. While pressing the surface of the raw material by using the encapsulant, the compound ZnTe is formed by directly synthesis of the components Zn and Te.

The temperature in the furnace is controlled as shown in the temperature distribution of FIG. 1A. The raw material is molten so as to leave a part of the raw material in a solid state. For example, when the temperature distribution is controlled so that the temperature of the surface of the raw material melt (reference A in FIG. 1A) is 10° C. higher than the melting point of the raw material melt, the temperature of the central portion of the crucible (reference B in FIG. 1A) is 13° C. higher than the melting point of the melt and the temperature of the bottom portion of the crucible (reference C in FIG. 1A) is 5° C. lower than the melting point of the melt, it is possible that only a part of the raw material is left in a solid state on the bottom portion of the crucible.

After the above temperature distribution is kept for a certain time, the temperature of the crucible is controlled so that the temperature of the surface of the melt is lower than the melting point of the raw material while keeping the temperature gradient of the raw material melt less than 10° C./cm (<10° C./cm). Then, the entire temperature decreases gradually. The melt is crystallized from the surface thereof.

Thereby, it is possible to reproducibly produce a high quality compound semiconductor single crystal in which a polycrystal or a twin is not generated.

Similarly, when the crucible shown in FIG. 1B is used, it is also possible to reproducibly produce a high quality compound semiconductor single crystal in which a polycrystal or a twin is not generated.

Although it is described that the present invention is applied to the VGF method in which the ZnTe single crystal is grown in the embodiment, the present invention can be applied to the VB method. Further, needless to say, the present invention can be applied to the growth of other compound semiconductor single crystals, such as a group II-VI, a group III-V compound semiconductor or the like.

EXAMPLE

Hereinafter, the features of the present invention will be clarified by showing a concrete example according to the embodiment.

Figure 2:
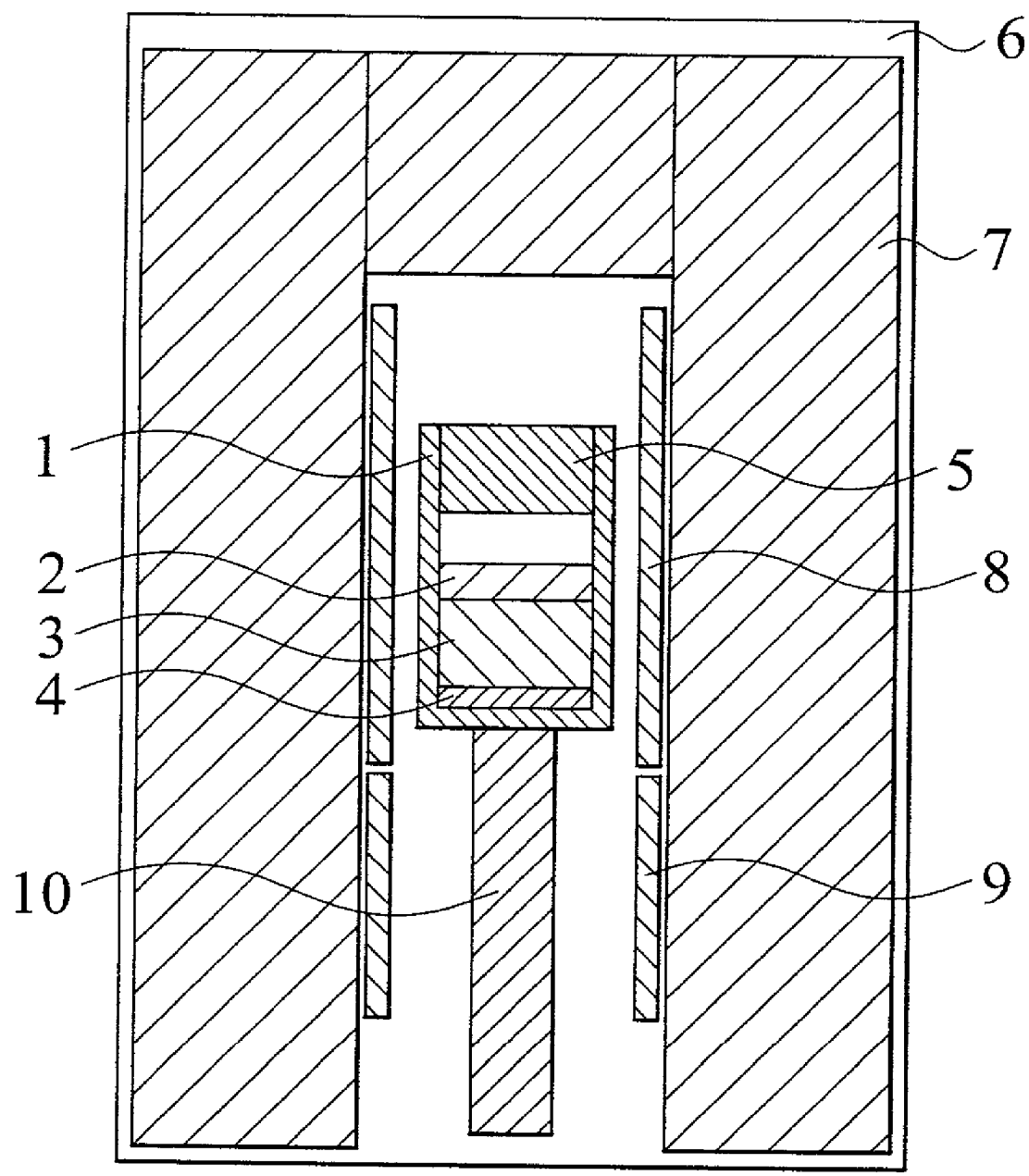
FIG. 2 is a schematic view of a crystal growth furnace which is used when the present invention is applied to the VGF method.

FIG. 2 is a schematic view showing a crystal growth furnace in the example, which is used when the present invention is applied to the VGF method. In the drawing, the reference numeral 6 denotes a high pressure container constructing the crystal growth furnace. The high pressure container 6 comprises an inlet (not shown in the drawing) for introducing a gas through a gas line. The reference numeral 7 denotes a heat insulator made of graphite felt, which is provided on an inner wall of the high pressure container 6. The heat insulator 7 has an excellent heat insulating property and is effective for increasing the thermal efficiency in the high pressure container 6. The reference numerals 8 and 9 denote an upper stage heater and a lower stage heater, respectively. Each heater is provided in the high pressure container 6 and has an inner diameter of 106 mm. When the upper stage heater 8 is a multi-stage heater formed so as to stack a plurality of heaters, the temperature distribution of the raw material melt which is put into the container for crystal growth can be precisely controlled. The reference numeral 1 denotes a crucible made of pBN as a container for crystal growth. The crucible 1 has an inner diameter of 70 mm, a thickness of 1 mm, and a flat bottom. The reference numeral 5 denotes a cover of the crucible 1. A vent (not shown in the drawing) is provided on the cover 5 in order to make the pressure in the crucible 1 equal to the pressure in the high pressure container 6. The reference numeral 10 denotes a supporter for setting the crucible 1 in the high pressure container 6.

As a raw material, 406 g of the component Zn having a purity of 99.9999% and 707 g of the component Te which were in the equivalent molar ratio, were put into the crucible 1. The components were covered with 88 g of the encapsulant ($B_2O_3$). The crucible 1 was set in the high pressure container 6. The pressure in the high pressure container 6 was adjusted to 30 kg/cm$^2$ by filling the furnace with an inert gas $N_2$. While pressing the surface of the raw material by the encapsulant 2, the crucible 1 was heated by the upper stage heater 8. The compound ZnTe was synthesized by directly compounding the components Zn and Te.

Next, while the pressure in the furnace was reduced to 10–20 kg/cm$^2$, the temperature in the furnace was controlled so that the temperature of the surface of the melt was 1310° C. (melting point of ZnTe: 1296° C.) and that a solid raw material was left on the bottom portion of the crucible. Then, the raw material was molten. The temperature was kept for 10 hours. In the concrete, the temperature was controlled so that the temperature of the point A was 1305° C., that of the point B was 1308° C. and that of the point C was 1290° C. in the temperature distribution shown in FIG. 1A.

Then, while keeping the temperature gradient of the raw material melt less than 10° C./cm (<10° C./cm), the temperature was controlled so that the temperature of the surface of the melt decreased. The entire temperature decreased gradually. The melt was crystallized from the surface thereof at a constant growth rate of 1 mm/h.

The entire furnace was cooled at a cooling rate of 100° C./h. When the furnace was cooled to a room temperature, the grown crystal was taken out of the heating furnace.

The obtained crystal was a ZnTe single crystal having a diameter of 70 mm and a total length of 50 mm. The characteristics of the obtained crystal were observed. As a result, a twin or a polycrystal was hardly found. The dislocation density of the obtained single crystal was examined by cutting the crystal. As a result, the dislocation density in every area of the crystal was not more than 10000 cm$^{-2}$. Further, the crystal growth was carried out four times similarly. As a result, all of the obtained crystals hardly had a polycrystal or a twin.

The present invention is not limited to the above example. For example, although the production of the ZnTe single crystal is explained in the above example, the present invention is effective for the cases that not only the compound semiconductor ZnTe but also compound semiconductors in which a twin is easily generated and in which it is hard to grow a single crystal, such as CdTe or the like, are produced in the VGF method or the VB method.

According to the present invention, because a compound semi conductor raw material is put into a crucible, the crucible is set in a vertical type of heating furnace to heat and melt the raw material by a heater, a nucleation is promoted on a surface of a raw material melt by leaving a solid raw material in a part of the raw material melt, the raw material melt is gradually solidified from the surface of the raw material melt without a seed crystal, and a crystal is grown by using a nucleus generated by the nucleation, it is possible to prevent a polycrystal to be generated by the supercooling from being grown. Further, it is possible to reproducibly produce a high quality compound semiconductor single crystal.

The entire disclosure of Japanese Patent Application No. Tokugan 2000-1675 filed on Jan. 7, 2000 including specification, claims drawings and summary are incorporated herein by reference in its entirety.

What is claimed is:

1. A process for producing compound semiconductor single crystal, comprising the steps of:
   a) placing a compound semiconductor raw material into a crucible;
   b) encapsulating the raw material;
   c) setting the crucible in a vertical type of a heating furnace to heat the raw material;
   d) melting the raw material;
   e) promoting a nucleation on a top surface of a raw material melt;
   f) solidifying the raw material gradually from the surface of the raw material melt without a seed crystal; and
   g) growing a crystal by using a nucleus generated by the nucleation,
   wherein a solid raw material is left in a part of the raw material so as to prevent the raw material melt from being supercooled.

2. The process of claim 1, wherein the raw material is ZnTe or CdTe.

3. The process of claim 1, wherein $B_2O_3$ is used to encapsulate the raw material.

4. The process of claim 1, wherein nucleation occurs on a top surface of raw material melt.

5. The process of claim 1, wherein nucleation occurs on a surface adjacent to the raw material melt.

6. The process of claim 1, wherein a temperature of the surface of the raw material melt is lower than a temperature of other part of the raw material in the promoting step.

7. The process of claim 3, wherein the top surface is a boundary between the raw material melt and the $B_2O_3$.

8. The process of claim 1, wherein the solid raw material is left on the bottom of the crucible.

9. The process of claim 1, wherein in the melting step, said raw material is caused to melt under conditions under which said raw material has a temperature distribution whereby a bottom-most portion of said raw material in said crucible is maintained in a solid state and the remaining portion is in the melt state.

* * * * *